US008775750B2

(12) United States Patent
Chong et al.

(10) Patent No.: US 8,775,750 B2
(45) Date of Patent: Jul. 8, 2014

(54) INTERLEAVER WITH PARALLEL ADDRESS QUEUE ARBITRATION DEPENDENT ON WHICH QUEUES ARE EMPTY

(75) Inventors: Sheng Wei Chong, Tokyo (JP); Hiroyuki Igura, Tokyo (JP)

(73) Assignee: Nec Corporation, Tokyo (JP)

( * ) Notice: Subject to any disclaimer, the term of this patent is extended or adjusted under 35 U.S.C. 154(b) by 161 days.

(21) Appl. No.: 13/496,472

(22) PCT Filed: Sep. 16, 2009

(86) PCT No.: PCT/JP2009/066717
§ 371 (c)(1),
(2), (4) Date: Mar. 15, 2012

(87) PCT Pub. No.: WO2011/033680
PCT Pub. Date: Mar. 24, 2011

(65) Prior Publication Data
US 2012/0173829 A1  Jul. 5, 2012

(51) Int. Cl.
*G06F 12/00* (2006.01)
*G06F 12/06* (2006.01)
*H03M 13/27* (2006.01)

(52) U.S. Cl.
CPC .................. *G06F 12/0607* (2013.01); *H03M 13/276* (2013.01)
USPC .................. 711/157; 711/E12.079

(58) Field of Classification Search
None
See application file for complete search history.

(56) References Cited

U.S. PATENT DOCUMENTS

| 5,717,394 | A | * | 2/1998 | Schwartz et al. ............... 341/51 |
| 5,946,710 | A | | 8/1999 | Bauman et al. |
| 6,574,766 | B2 | | 6/2003 | Obuchi et al. |
| 6,687,796 | B1 | | 2/2004 | Laine et al. |
| 6,701,425 | B1 | | 3/2004 | Dabbagh et al. |
| 7,343,530 | B2 | | 3/2008 | Shin |
| 7,783,936 | B1 | * | 8/2010 | Hall et al. ..................... 714/701 |
| 2003/0149849 | A1 | * | 8/2003 | Kim et al. ..................... 711/157 |
| 2004/0202163 | A1 | | 10/2004 | Lee |
| 2005/0193308 | A1 | * | 9/2005 | Shin ............................. 714/752 |
| 2006/0020743 | A1 | * | 1/2006 | Au et al. ....................... 711/101 |
| 2006/0083174 | A1 | * | 4/2006 | Shim et al. ..................... 370/245 |
| 2007/0139428 | A1 | * | 6/2007 | Berkeman ..................... 345/565 |

FOREIGN PATENT DOCUMENTS

| EP | 1050806 A1 | 11/2000 |
| EP | 1059588 A1 | 12/2000 |
| EP | 1850486 A1 | 10/2007 |
| JP | 07-254862 A | 10/1995 |
| WO | WO03/058823 A1 | 7/2003 |
| WO | WO2005/091509 A1 | 9/2005 |

OTHER PUBLICATIONS

International Search Report in PCT/JP2009/066717 dated Feb. 9, 2010 (English Translation Thereof).

* cited by examiner

*Primary Examiner* — April Y Blair
*Assistant Examiner* — Michael C Kolb
(74) *Attorney, Agent, or Firm* — McGinn IP Law Group, PLLC

(57) ABSTRACT

An interleaving method includes: generating multiple read-addresses for respective bits of multiple write-words; queuing the read-addresses in parallel in multiple address queues; selecting an address queue among the address queues that is not empty based on status of each address queue; decoding the address from the selected address queue to a read-address and a bit-address; extracting a read-word from data to be interleaved based on the read-address; selecting a write-bit from the read-word based on the bit-address; arbitrating an individual write-bit to one of the write-words based on an address queue ID of the selected address queue; and generating write-addresses for respective write-words.

19 Claims, 8 Drawing Sheets

INTERLEAVER WITH PARALLEL ADDRESS QUEUE ARBITRATION DEPENDENT ON WHICH QUEUES ARE EMPTY

TECHNICAL FIELD

The present invention is related to the technical field of an interleaver and an interleaving method used in, for example, digital signal processing, where the interleaver is compliant to various interleave patterns, for example as required by baseband LSIs (Large Scale Integration circuits) targeting various wireless communication standards.

BACKGROUND ART

Wireless communication systems often suffer from burst errors which occur in data transmitted over wireless channels. Interleaving and deinterleaving of data is a key technology for reducing influence of the burst errors. Wireless communication systems require interleavers for effective error correction. One of the interleavers is a bit interleaver which permutes bits stored in a memory at different addresses. The addresses are based on interleave patterns that vary among different wireless communication standards or specifications. Therefore, address generation for an interleaver targeting different wireless communication standards requires a flexible address generator. In wireless communications, an address generator needs to consecutively generate a large number of complicated addresses based on an interleave pattern.

In related arts of the present invention, a flexible address generator which generates such complicated addresses based on any interleave pattern is realized using a typical processor such as a CPU (Central Processing Unit) or a microprocessor. Such a processor may be implemented by software run on a CPU. A typical processor provides flexibility in generation of complicated addresses at the cost of low throughput. Each of the complicated addresses is generated using a sequence of ordinary instructions because no single-cycle instruction is available for address generation in a typical processor. The sequence is executed using multiple instruction cycles. Further, the number of instruction cycles for generating one address varies for each address to be generated. These reduce throughput of the address generator implemented with a typical processor.

Note that a deinterleaver for data which has been interleaved with a certain interleave pattern can be realized using an interleaver with an interleave pattern which is the inverse of the certain interleave pattern. Therefore, an interleaver with a flexible address generator functions as a deinterleaver for data interleaved by various interleave patterns.

Various types of interleavers and address generators are proposed in related arts of the present invention.

WO03/058823 discloses an interleaving apparatus with a flexible address generator which generates addresses for the various interleaver sizes thorough a single algorithm. However, this address generator is implemented by a typical processor or CPU and suffers low throughput.

EP-1850486-A1 discloses a parallel interleaver in which multiple interleaver circuits are arranged in parallel in order to realize high-speed, low-delay interleave processing. The parallel interleaver is capable of flexibly coping with modification of an interleave pattern. However, the circuitry of the parallel interleaver is very large and the address generator used therein has also a complicated arrangement.

U.S. Pat. No. 7,343,530-B2 discloses an address generator based on a SIMD (single-instruction and multiple-data) processor. The address generator generates multiple addresses in parallel to reduce number of address generation cycles. However, customized address generation instructions is required to generate one address every cycle. Due to limited instruction opcodes (operation codes) for customized instructions, it is not practical to provide customized instructions required by all interleave patterns. Therefore, U.S. Pat. No. 7,343,530-B2 does not teach a high throughput interleaver that is flexible for all interleave patterns.

U.S. Pat. No. 6,574,766-B2 discloses an interleaving-deinterleaving apparatus with a customized address generator which reduces the number of cycles for address generation. Each customized address generator includes a counter and a look-up table to which the output of the counter is supplied. A memory can function as an interleaver and a deinterleaver depending on the selection of outputs of the customized address generator. Due to limited flexibility of the customized address generator, U.S. Pat. No. 6,574,766-B2 does not teach a high throughput interleaver that is flexible for all interleave patterns.

JP-7-254862-A discloses an interleaving-deinterleaving circuit which copes with a plurality of interleave formats. The circuit includes: a memory, a plurality of counters, a multiplexer generating a memory address by combining the outputs of counters, and a mode controller initializing the counters to values corresponding the selected interleave format when the counters deliver ripple-carry signals. However, since the address is generated based on the counted values, the interleaver is not flexible for all arbitrary interleave patterns.

WO2005/091509 discloses a multiple-processor-based address generator which generates an address value for addressing an interleaver memory, wherein consecutive address fragments to which an MSB (Most Significant Bit) is to be appended are generated. In the address generator, only a fraction of the address fragments generated, which potentially will exceed a maximum allowable value, is compared with the maximum allowable value.

FIG. 1 illustrates the address generator of WO2005/091509. This address generator 800 includes: a predetermined number of registers 810a to 810d; multiplexer 820a to 820d connected to the inputs of registers 810a to 810d, respectively; first permutation unit 830a supplied with the outputs of registers 810a to 810d; first address fragment calculation unit 840a supplied with the outputs of registers 810a to 810d; second permutation unit 830b supplied with the multiple outputs of first address fragment calculation unit 840a; second address fragment calculation unit 840b supplied with the multiple outputs of first address fragment calculation unit 840a; arbiter (or selector) 850 selecting one of outputs of first and second permutation units 830a and 830b; comparator 860 supplying control signals E and M to registers 810a to 810d and arbiter 850, respectively; and a toggle unit 870 adapted to concatenate or append one of several MSBs to the output of arbiter 850.

FIG. 2 illustrates the operation of the address generator shown in FIG. 1. First, the procedure is initialized in step 900, then the odd address fragment is loaded into the registers at step 901, the next and second next address fragments are generated at step 902, and the odd and next address fragments are permuted at step 903. After the permutation, it is judged whether the odd permuted address fragment is within range in step 904. If yes, the MSB is appended to the odd permuted address fragment in step 905, the present values of the registers are withheld in step 906, the generated address value is outputted in step 907, and then the procedure proceeds to step 908. If no in step 904, the procedure directly proceeds to step 908.

In step 908, the MSB is appended to the next permuted address fragment, and then the next address value is outputted in step 909. In step 910, it is determined whether all possible address values have been generated or not. If not, the procedure returns to step 901. Otherwise, the procedure is ended.

The address generator of WO2005/091509 is characterized in that it includes two permutation units 830a and 830b and arbiter 850. The output of first permutation unit 830a is an odd address fragment denoted as $A_{odd}$ while the output of second permutation unit 830b is an even address fragment denoted as $A_{even}$. If $A_{odd}$ is within a desired range, as shown in step 904 of FIG. 2, arbiter 850 selects $A_{odd}$ as the current output. Then arbiter 850 selects $A_{even}$ as the next output. This means in the current cycle, if $A_{odd}$ is not ready but $A_{even}$ is ready, arbiter 850 cannot select $A_{even}$ as the output of the current cycle. As a result, there is no output in the current cycle and throughput of the address generator is reduced. In other words, wait cycles are necessary if address from permutation 830a or permutation unit 830b is not ready. Therefore, WO2005/091509 does not teach a high throughput interleaver that is flexible for all interleave patterns.

SUMMARY OF INVENTION

Technical Problem

As described above, the known interleaver or address generator flexible for all interleave patterns does not have high throughput.

An exemplary object of the present invention is to provide a high throughput interleaver that is flexible for all interleave patterns including complicated patterns used in some of wireless communication standards.

Another exemplary object of the present invention is to provide an interleaving method with high throughput that is flexible for all interleave patterns including complicated patterns used in some of wireless communication standards.

Solution to Problem

According to one exemplary aspect of the present invention, an interleaver includes: multiple processors generating read-addresses in parallel for respective bits of multiple write-words; multiple address queues queuing the read-addresses received from the respective processors, each of the address queues outputting status thereof; a first arbiter selecting an address queue among the multiple address queues that is not empty based on the status of each address queue, the first arbiter being outputting an address from the selected address queue while outputting an address queue ID of the selected address queue; a decoder decoding the address from the selected address queue into a word-address and a bit-address; an input storage storing data to be interleaved, the input storage outputting a read-word based on the word-address; a first selector selecting a write-bit from the read-word based on the bit-address; a write controller arbitrating an individual write-bit to one of the write-words based on the address queue ID, the write controller generating write-addresses for respective write-words; and an output storage storing the write-word based on the write-address.

According to another exemplary aspect of the present invention, an interleaving method includes: generating multiple read-addresses for respective bits of multiple write-words; queuing the multiple read-addresses in parallel in multiple address queues; selecting an address queue among the multiple address queues that is not empty based on status of each address queue; decoding the address from the selected address queue as a read-address and as a bit-address; extracting a read-word from data to be interleaved based on the read-address; selecting a write-bit from the read-word based on the bit-address; arbitrating an individual write-bit to one of the write-words based on an address queue ID of the selected address queue; and generating write-addresses for respective write-words.

According to the exemplary aspects of the present invention, it is possible to provide a read-address whenever there is an address queue that is not empty. This reduces the cycles of waiting for an address from any empty address queue. The exemplary aspects of the present invention have an exemplary advantageous effect that a high throughput interleaver can be realized.

These and other advantages of the invention will be apparent to those of ordinary skill in the art by reference to the following detailed description and the accompanying drawings.

DESCRIPTION OF EMBODIMENTS

The present invention will be described more fully hereinafter with reference to the accompanying drawings, in which the block diagrams of the exemplary embodiments of the present invention are shown.

Figure 1:
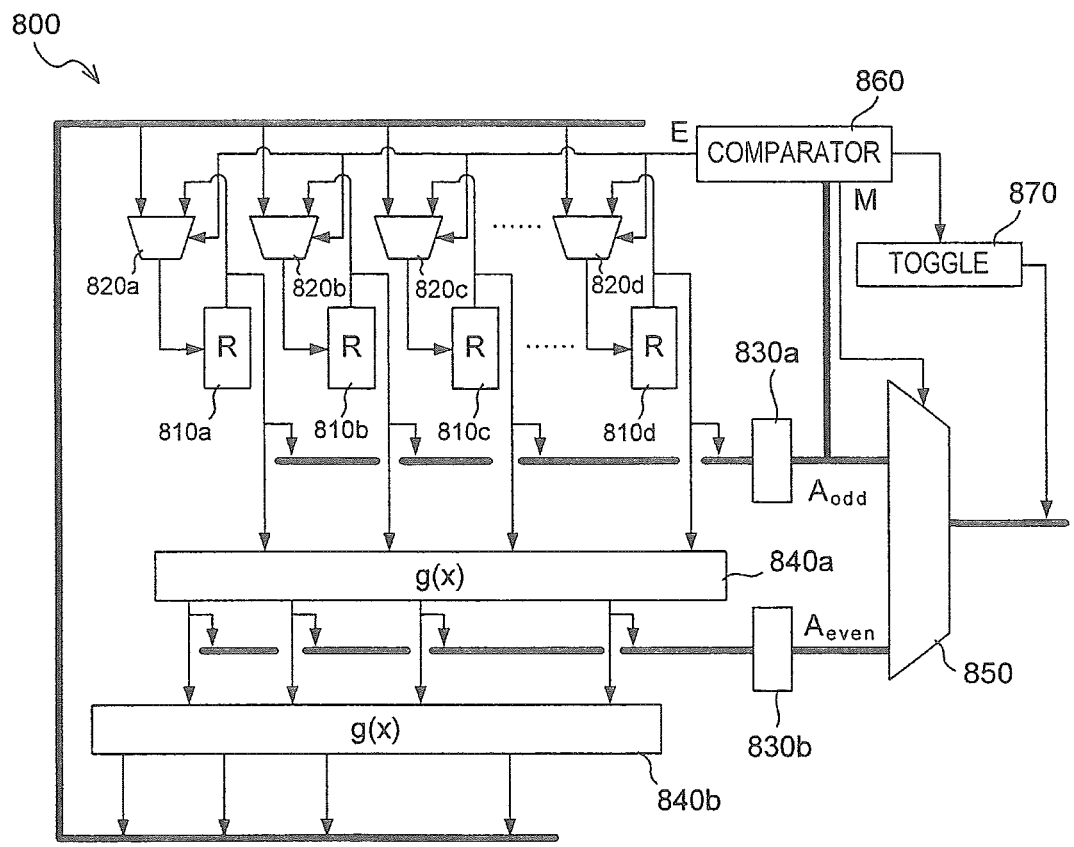
FIG. 1 is a block diagram of a multiple-processor-based address generator in the related art.
Figure 2:
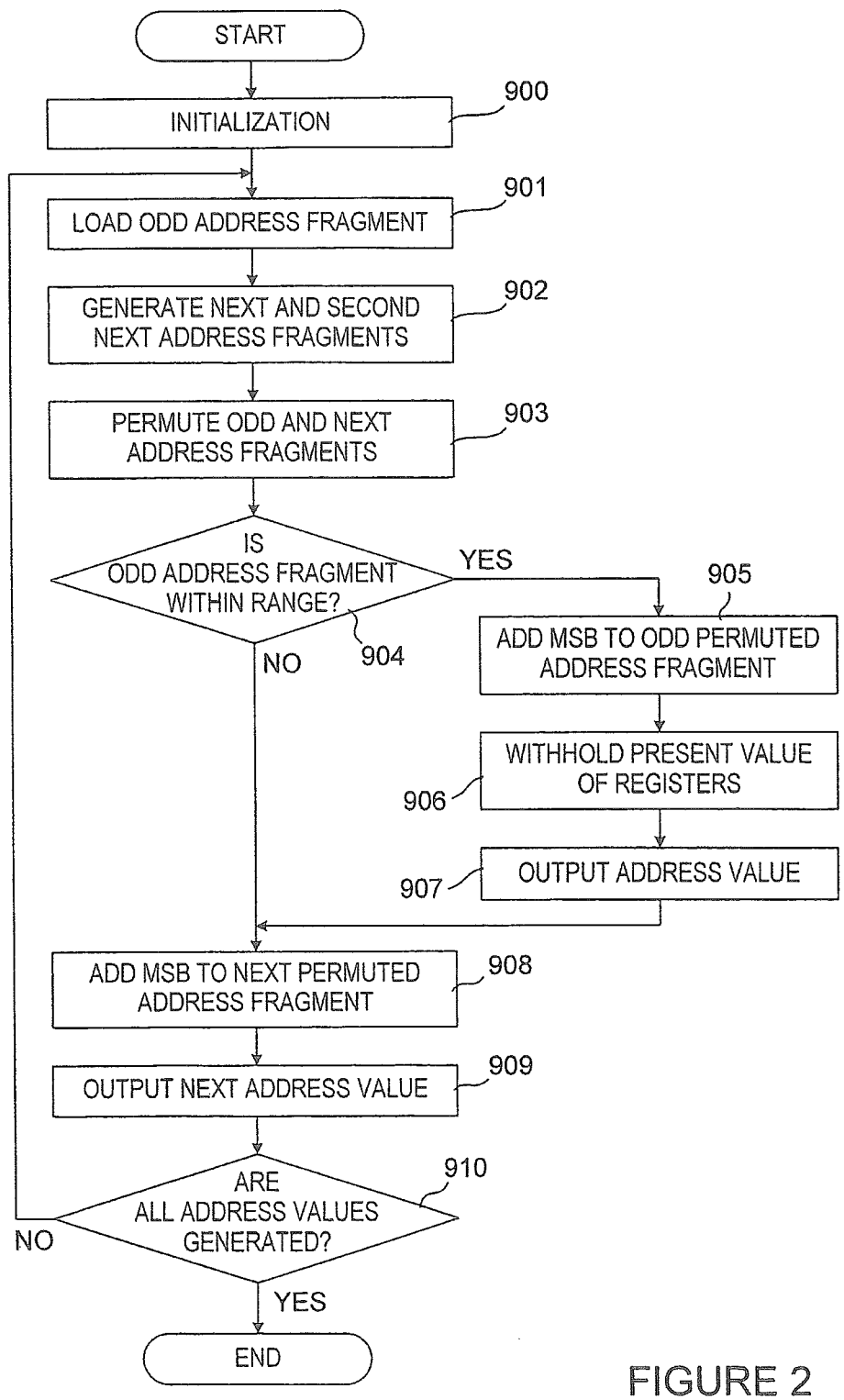
FIG. 2 is a flow chart showing the operation of the address generator shown in FIG. 1.
Figure 3:
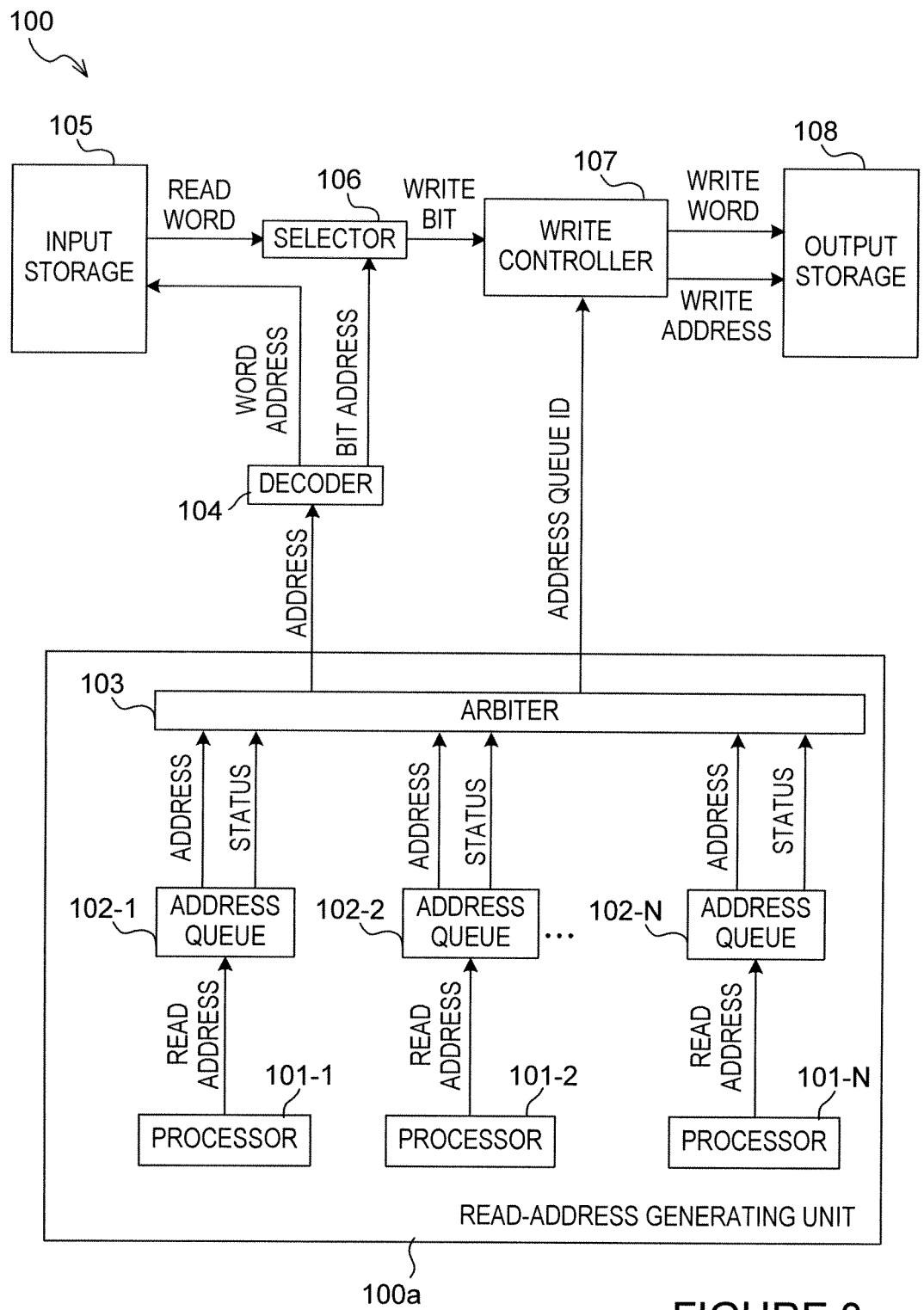
FIG. 3 is a block diagram of an interleaver according to an exemplary embodiment of the present invention.

As shown in FIG. 3, interleaver 100 according to an exemplary embodiment of the present invention includes: N pieces of processors 101-1 to 101-N, N being an integer larger than one (1); N pieces of address queues 102-1 to 102-N respectively arranged for processors 101-1 to 101-N; address arbiter 103 commonly provided for address queues 102-1 to 102-N; decoder 104; input storage 105; selector 106; write controller 107; and output storage 108. Note that processors 101-1 to 101-N, address queues 102-1 to 102-N and arbiter 103 constitutes read-address generating unit 100a of this interleaver. Interleaver 100 is configured as a bit-interleaver which interleaves data bit-by-bit.

In this arrangement, each of processors 101-1 to 101-N is configured to generate and output a read-address for a corresponding bit of multiple write-words. Since multiple processors 101-1 to 101-N are arranged parallel to each other, the processors generate the read-addresses for respective bits of the multiple write words in parallel as a whole. As described later, processors 101-1 to 101-N are preferably programmable to generate addresses for any possible interleave patterns. For example, processors 101-1 to 101-N are programmable processors. Multiple address queues 102-1 to 102-N are configured to queue and output the addresses supplied from respective processors 101-1 to 101-N. Each of address queues 102-1 to 102-N further outputs a status signal which is indicative of the status of the relevant address queue. Address arbiter 103 is configured to select one of address queues 102-1 to 102-N to output the selected address and address queue ID. In this exemplary embodiment, each of address queues 102-1 to 102-N is assigned with a different ID (identification number), and the address arbiter 103 outputs the ID of the selected address queue as the address queue ID. The selected address queue is one of any address queues with status of not empty. The empty status is indicated by the status signal supplied to arbiter 103.

Decoder 104 is configured to receive the selected address from arbiter 103 and decode the received address into a read-address, which is a word-address, and a bit-address. The read-address is supplied to input storage while the bit-address is supplied to selector 106. Input storage 105 is configured to receive and store data to be interleaved, select a read-word from the stored data based on the read-address, and output the read-word. Selector 106 is configured to receive the read-word from input storage 105 and select a write-bit from the received read-word based on the bit-address. The selected write-bit is supplied to write controller 107.

Write controller 107 is configured to pack the received write-bit to the corresponding write-word based on the address queue ID received from arbiter 103 and generate write-addresses for the respective write-words. The write-words are sent to output storage 108 together with the generated write addresses. Output storage 108 is configured to store the write-words based on the write-addresses. The interleaved data can be read out from output storage 108.

Figure 4:
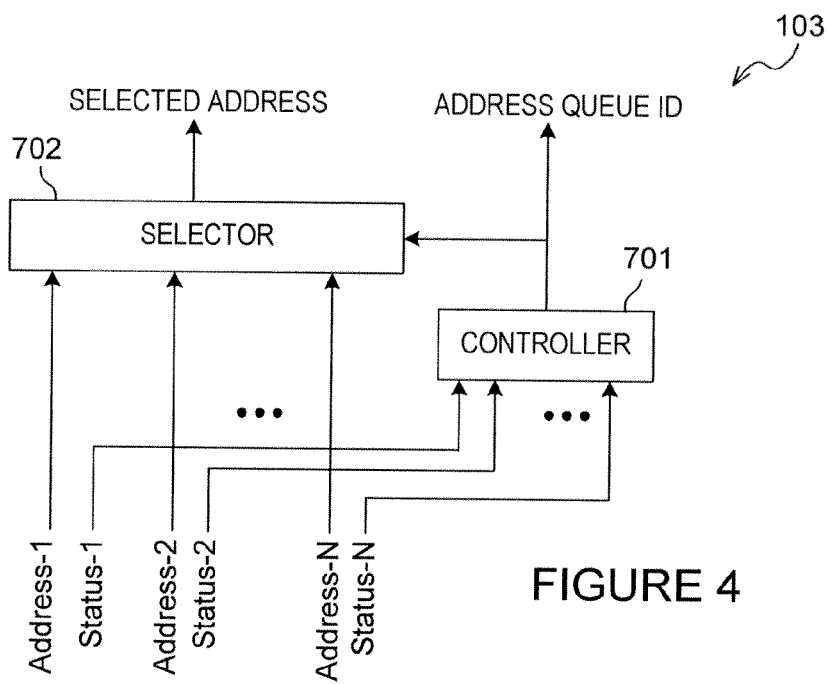
FIG. 4 is a block diagram showing an exemplary arrangement of an arbiter used in the interleaver shown in FIG. 3.

FIG. 4 shows an example of the constitution of arbiter 103. Arbiter 103 includes controller 701 and selector 702. When the interleaver has N pieces of processors 101-1 to 101-N, N being an integer larger than one, arbiter 103 receives N pairs of address (address-1 to address-N) and status (status-1 to status-N) as inputs. Controller 701 is configure to examine status inputs (status-1 to status-N) and output the ID of any address queue 102-1 to 102-N with status of not empty. The ID is supplied to selector 702 and write controller as the address queue ID. Based on the ID from controller 701, the selector 702 selects one of input addresses (address-1 to address-N) as an output address, i.e., the selected address. Arbiter 103 is typically initialized by an external CPU (not shown).

Figure 5:
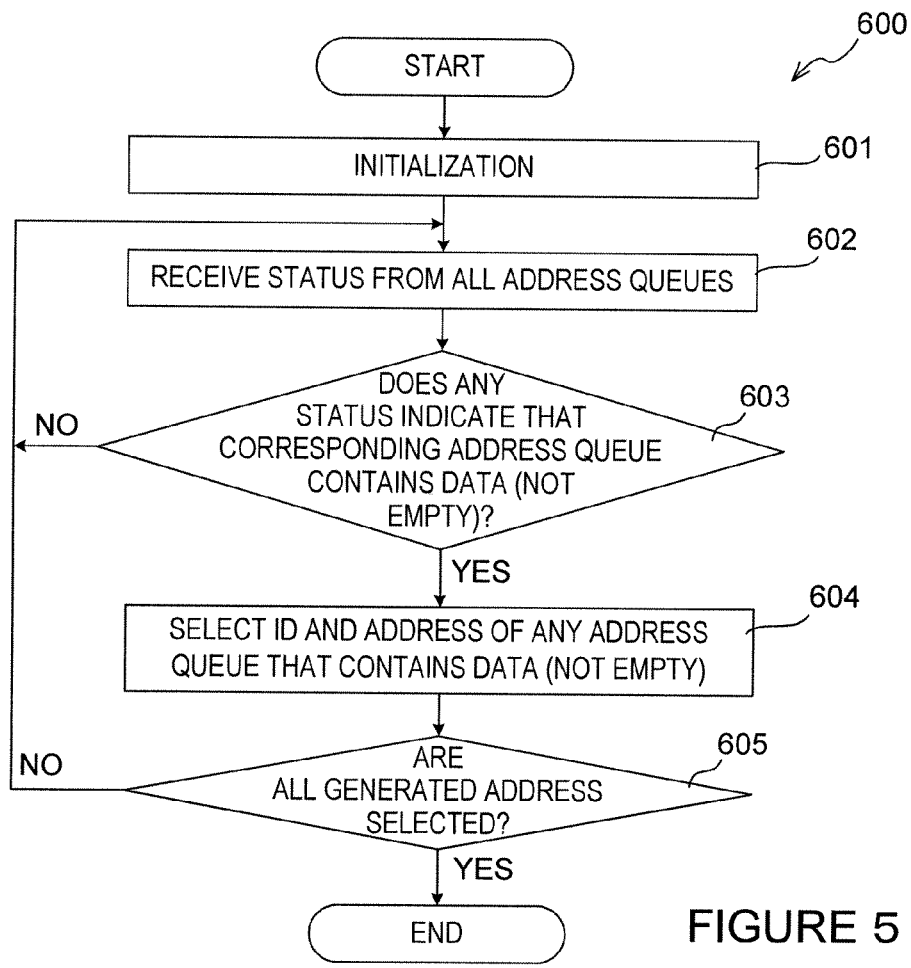
FIG. 5 is a flow chart showing an exemplary operation of the arbiter shown in FIG. 4.

FIG. 5 shows flow chart 600 illustrating an example of operation of arbiter 103. First, arbiter 103 is initialized by an external CPU (not shown) at box 601. Then, in box 602, arbiter 103 receives statuses from all address queues 102-1 to 102-N. In box 603, controller 701 determines whether any status indicates that the corresponding address queue contains address data or not. In other words, controller 701 searches for the address queue which is not empty. If none of the queues contains the address, the procedure shown in box 602 is repeated. Otherwise, in box 604, controller 701 outputs ID of any address queue 102-1 to 102-N that contains data; and selector 702 selects the output of address queues 102-1 to 102-N based on the ID from controller 701. Then in box 605, controller 702 determines whether all addresses from processors 101-1 to 102-N are selected or not. If not, the process goes back to box 602, otherwise, the operation of arbiter 103 is ended.

In the present exemplary embodiment, arbiter 103 is capable to select any non-empty address queue for outputting an address. There is no cycle of waiting data from an empty address queue as long as there is any non-empty address queue. Therefore, it is possible to reduce the number of wait cycles in the present exemplary embodiment and the reduced wait cycles leads to higher throughput of the interleaver than that of an interleaver which waits until all addresses become ready.

Arbiter 103 is capable to output an address queue ID of the selected address queue. Write controller 107 arbitrates the write-bits to respective write-words based on the address queue ID from the arbiter 103.

Figure 6:
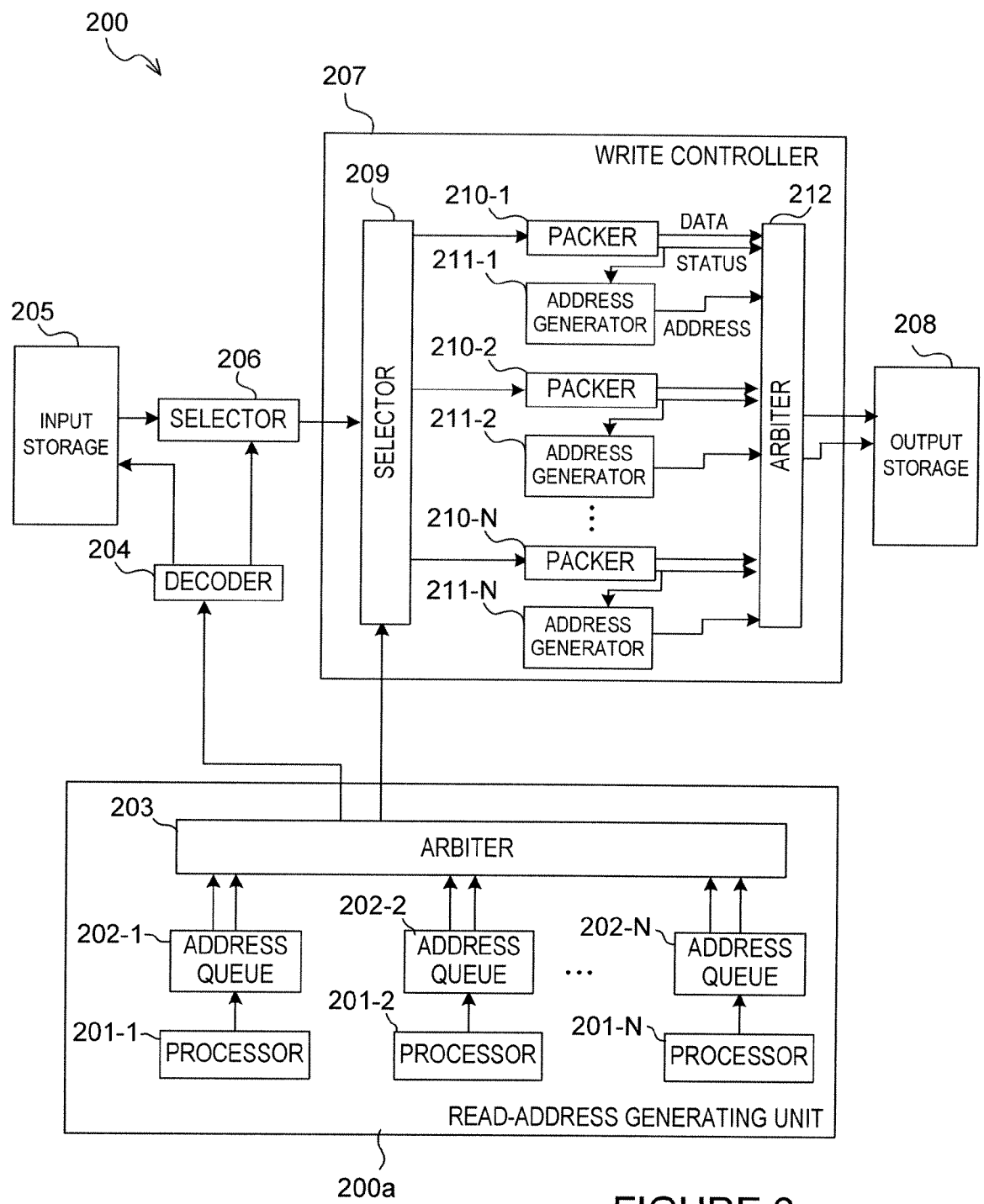
FIG. 6 is a block diagram of another exemplary interleaver.

FIG. 6 shows another example of the interleaver according to the present exemplary embodiment. Interleaver 200 shown in FIG. 6 is same with interleaver 100 shown in FIG. 3 except the constitution of the write controller 207 as described below. In FIG. 6, components corresponding to those in FIG. 3 are designated with the reference numerals having the same last two digits as those in FIG. 3. Therefore, interleaver includes: multiple processors 201-1 to 201-N; multiple address queues 202-1 to 202-N; address arbiter 203; decoder 204; input storage 205; selector 206; write controller 207; and output storage 208. Here, N is an integer larger than one. Processors 201-1 to 201-N, address queues 202-1 to 202-N and arbiter 203 constitutes read-address generating unit 200a of this interleaver.

In interleaver 200, write controller 207 includes: selector 209; N pieces of packers 210-1 to 210-N; N pieces of address generators 211-1 to 211-N; and arbiter 212. Selector 209 is connected to the write-bit output of selector 206 and selects one of packers 210-1 to 210-N based on the address queue ID received from arbiter 203. Selector 209 sends the received write-bits to the selected packer.

Each of packers 210-1 to 210-N may be a well-known conventional packer that includes a barrel shifter. Packers 210-1 to 210-N pack the received write-bits mentioned above as respective write-words to output the write-words as data. Packers 210-1 to 210-N also output status signals each indicating status of the corresponding write-word. Address generators 211-1 to 211-N are configured to generate write-addresses for the write-words in the respective packers 210-1 to 210-N.

Arbiter 212 is configured to select any packer 210-1 to 210-N with a full write-word to output write-data. In this case, the status full means that the thirty-two (32) bits, i.e., four bytes, are packed into the write-word. A full write-word is indicated by the status signal from each of individual address packers 210-1 to 210-N to the arbiter 212. Based on the status signal, the arbiter 212 also selects one of address generators 211-1 to 211-N to output a write-address. Address generators 211-1 to 211-N also update their addresses based on the status signals from individual address packers 210-1 to 210-N. Structure of arbiter 212 is the same as arbiter 103 shown in FIG. 4 where "address-1" to "address-N" corresponds to write data from packers 210-1 to 210-N, respectively.

The operation of interleaver 200 will be described below.

First, the interleaver is initialized. Processors 201-1 to 201-N are programmed by an external CPU (not shown) to generate addresses for adjacent write-hits of respective write-words. Statuses of write-words in packers 210-1 to 210-N are initialized by an external CPU (not shown) as empty. Address generators 211-1 to 211-N are also initialized by an external CPU (not shown) to generate the initial write-addresses for respective write-words.

After the initialization, the interleaving operation will starts. For every integer k with range from one to N, N being an integer larger than one, an address generated by processor 201-k is outputted to addresses queue 202-k. Arbiter 203 selects any address queue 202-1 to 202-N which has a status of "not empty." The selected address queue outputs an address as the input of decoder 204. Arbiter 203 also outputs the address queue ID of the selected address queue to write controller 207.

Decoder 204 receives the address and decodes the address into a read-address (i.e., word address) supplied to input storage 205 and a bit-address supplied to selector 206. Based on the read-address, input storage 205 outputs a read-word to selector 206. Based on the bit-address, selector 206 selects one bit from the read-word as a write-bit supplied to write controller 207.

In the write controller 207, based on the address queue ID from arbiter 203, selector 209 selects one of the packers 210-1 to 210-N which is to receive the write-bit from selector 206. The selected packer packs the received write-bit into a write-word register arranged in the packer.

Once the above operation is repeated until a write-word in any packer 210-1 to 210-N is full, arbiter 212 selects the write-word in the packer as a write-word to be outputted and selects the address from address generators 211-1 to 211-N as a write-address to be outputted. The selected write-word and selected write-address are supplied to output storage 208. Once output storage 208 stores the write-word based on the write-address, the selected packer sets its write-word as empty and the selected address generator updates its write-address. The above interleave operation is repeated until all write-words are stored in output storage 208.

According to the arrangement shown in FIG. 6, a high throughput interleaver can be realized by using address arbiter 203 which select any address queue 202-1 to 202-N that is not empty for outputting an address. Address arbiter 203 also outputs the ID of the selected address queue to write controller 207. Write controller 207 packs a write-bit to the corresponding write-word based on the address queue ID. One of advantageous effects of this interleaver is being capable to provide a read-address whenever there is an address queue that is not empty. Thus, the cycles of waiting for address from empty address queue are reduced. Therefore, interleaver 200 has high throughput as the interleaver shown in FIG. 3.

Figure 7:
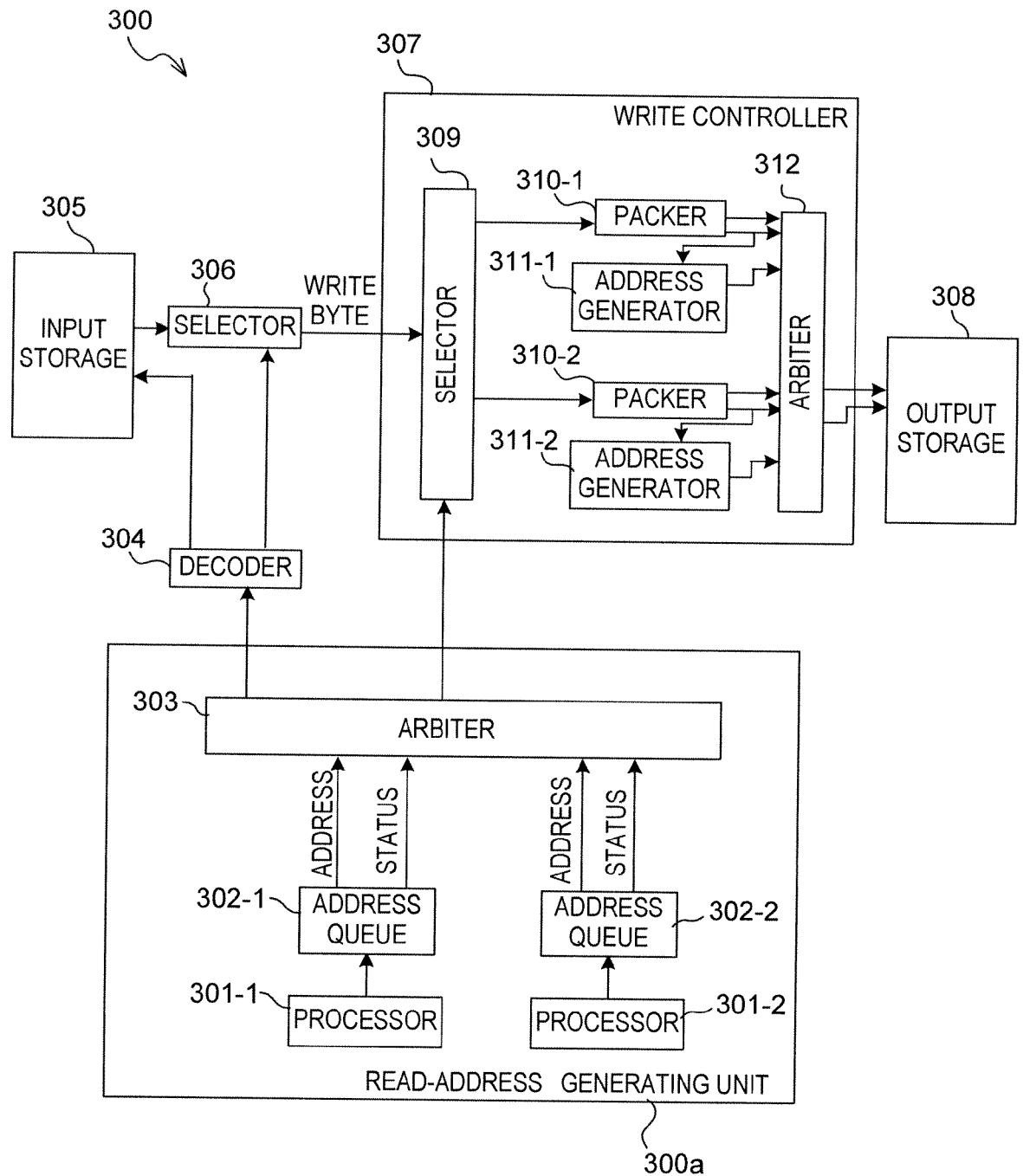
FIG. 7 is a block diagram of an exemplary byte interleaver.

Although the exemplary embodiment is described for a bit-interleaver where the output data width of selector 206 is one bit, the present exemplary embodiment is also applicable for interleavers which have a D-bit data width for the output of selector 206, where D is an integer between one and the number of bits in the read-word of selector 206. This is possible by using selector 206 to select D adjacent-bits from the read-word based on the bit-address from decoder 204, and by designing the output data width of selector 206 as D bits. For example, the present exemplary embodiment is applicable for a byte interleaver, by using selector 206 to select one byte (i.e., eight bits) from the read-word based on the bit-address from decoder 204, and by designing the output data width of selector 206 output as one byte. FIG. 7 shows an example of a byte interleaver according to the present exemplary embodiment.

Interleaver 300 shown in FIG. 7 corresponds to a case where the number of processors in the address generators in the above-described interleavers is two, i.e., N=2. In FIG. 7, components corresponding to those in FIG. 3 are designated with the reference numerals having the same last two digits as those in FIG. 6. Therefore, interleaver 300 includes: two processors 301-1 and 301-2; two address queues 302-1 and 302-2; address arbiter 303; decoder 304; input storage 305; selector 306; write controller 307; and output storage 308. Write controller 307 includes: selector 309; two packers 310-1 and 310-2; two write-address generators 311-1 and 311-2; and arbiter 312. Processors 301-1 and 301-2, address queues 302-1 and 302-2 and address arbiter 303 constitute read-address generating unit 300a of interleaver 300.

Figure 8:
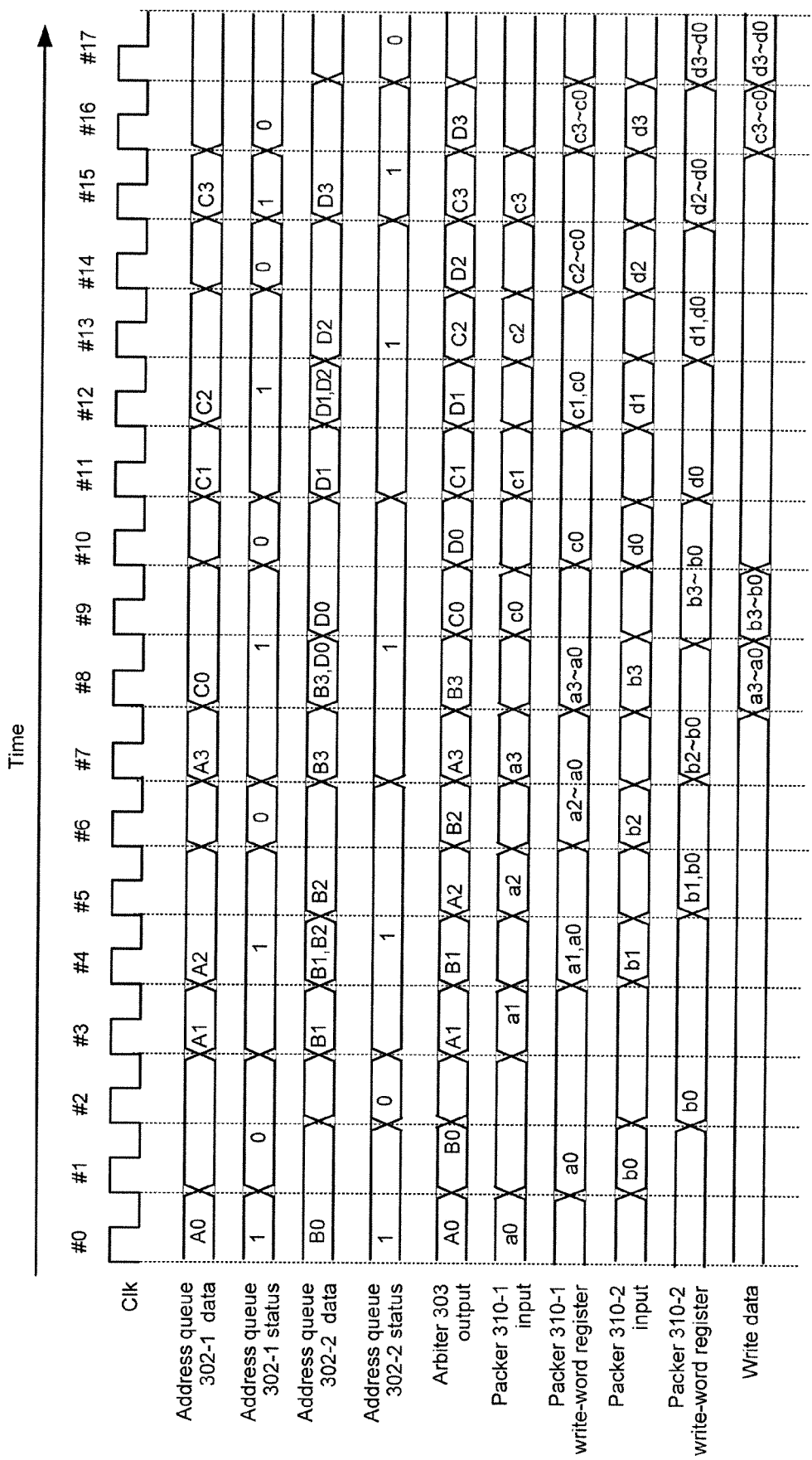
FIG. 8 is a timing chart showing the operation of the interleaver shown in FIG. 7.

Operation of interleaver 300 will be described based on the exemplary timing chart shown in FIG. 8. In the timing chart, sixteen (16) addresses (A0 to A3, B0 to B3, C0 to C3, and D0 to D3) are generated to read sixteen read-words from input storage 305. Clock signal Clk represented in the first raw of the timing chart defines the operation cycles of interleaver 300 and each operation cycle starts at every leading edge. In FIG. 8, total eighteen cycles #0 to #17 are illustrated, and status is represented by "1" for containing data and "0" for empty. Eight-bit blocks from the respective read-words are selected as write-bytes (a0 to a3, b0 to b3, c0 to c3, and d0 to d3). Four write-bytes are packed as a write-word to be stored in output storage 308. It is assumed that generation of addresses A0, A2, C0, and C2 requires one cycle each while generation of addresses A1, A3, C1, and C3 requires three cycles each.

First, an external CPU (not shown) initializes processors 301-1 and 301-2. The external CPU also initializes write-address generators 311-1 and 311-2. Then, processor 301-1 sequentially generates addresses A0 to A3 and C0 to C3 while processor 301-2 sequentially generates addresses B0 to B3 and D0 to D3. Both processors 301-1 and 301-2 operate in parallel.

At cycle #0, address queue 302-1 contains address A0. Status of address queue 302-1 is not empty (indicated by "1"). Therefore, arbiter 303 outputs address A0 and the ID of address queue 302-1. Address A0 is then decoded to access a read word. Selector 309 then selects one byte from the read word as write-byte a0. Based on the address queue ID from arbiter 303, selector 309 then selects packer 310-1 to pack write-byte a0. Note that write byte a0 will be latched in a write-word register in packer 310-1 at one cycle later, i.e., in cycle #1.

At cycle #1, there is no address in address queue 302-1 because address A0 has been outputted in cycle #0 and address A1 will be inputted at cycle #3. Therefore, status of address queue 302-1 is empty (indicated by "0"). Address queue 302-2 contains address B0. Status of address queue 302-2 is not empty. Instead of waiting for address A1 from address queue 302-1, arbiter 303 selects address B0 from address queue 302-2. This capability of selecting any address queue that contains data is not available in an interleaver of the related art described in, for example, WO2005/091509.

At cycles #2 to #7, the operations at cycles #0 to #1 are repeated for addresses A1 to A3, and B1 to B3 and the respective write-bytes (a1 to a3, and b1 to b3).

At cycle #8, the write-word register in packer 310-1 is full after storing write-bytes a0 to a3. Therefore, arbiter 312 selects write-bytes a0 to a3 as the write data and selects output of address generator 311-1 as the write address. Note that the operations of arbiter 312 and address generator 311 are the same as operations of arbiter 212 and address generator 211 explained above in connection with FIG. 6, and the details of the operations are not repeatedly described here.

At cycles #8 to #16, the operations at cycle #0 to #7 are repeated for address C0 to C3 and D0 to D3 and the respective write-bytes (c0 to c3, and d0 to d3). At each of cycles #9, #16 and #17, the write word registers are full and arbiter 312 selects the write data and address accordingly.

Figure 9:
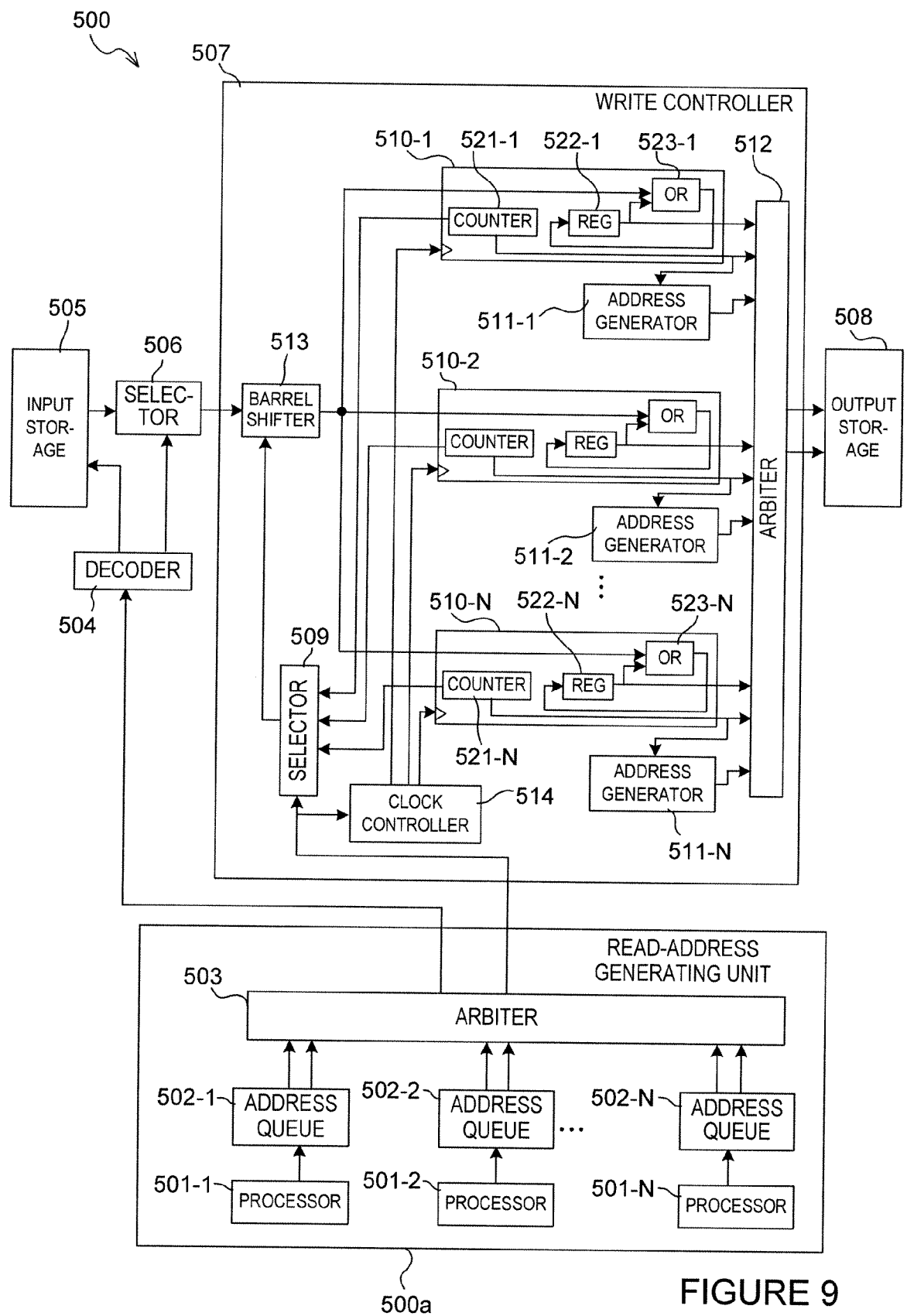
FIG. 9 is a block diagram of an interleaver according to another exemplary embodiment of the present invention.

FIG. 9 shows an interleaver according to another exemplary embodiment of the present invention. Interleaver 500 shown in FIG. 9 is the same with interleaver 200 shown in FIG. 6 except that some new elements are added to the write controller. Therefore, interleaver 500 is capable to demonstrate the advantageous effects described above in connection with interleaver 200 shown in FIG. 6. In FIG. 9, components corresponding to those in FIG. 6 are designated with the reference numerals having the same last two digits as those in FIG. 6.

The newly added elements in write controller 507 are barrel shifter 513, selector 509, clock controller 514 generating a clock signal, and shifter-less packers 510-1 to 510-N. Since the barrel shifter is independently provided, each packer in write controller 507 does not have a barrel shifter. Therefore, write controller 507 includes: barrel shifter 513; selector 509; N pieces of shifter-less packers 510-1 to 510-N; clock controller 514 generating a clock signal; N pieces of address generators 511-1 to 511-N; and arbiter 512.

For the description of interleaver 500, only structure and operation that is different from interleaver 200 shown in FIG. 6 will be described below.

Barrel shifter 513 is configured to shift the write-bit from selector 506 based on a control signal from selector 509. Selector 509 is configured to select the number of packed write-bits from one of the shifter-less packers 510-1 to 510-N based on the address queue ID from arbiter 503. The selected output of selector 509 is the control signal for barrel shifter 513.

Shifter-less packers 510-1 to 510-N are configured to pack the output of barrel shifter 513 as a write-word. This packing is performed when clock controller 514 enables a clock signal for one of shifter-less packers 510-1 to 510-N. Clock controller 514 configured to enable the clock signal supplied to one of shifter-less packers 510-1 to 510-N based on the address queue ID from arbiter 503. For example, if the ID of address queue 502-k is outputted by arbiter 503, clock controller 514 enables a clock signal for shifter-less packer 510-k. Address generators 511-1 to 511-N are configured to generate write-addresses for the write-words of respective shifter-less packers 510-1 to 510-N. Arbiter 512 is configured to select any shifter-less packer 510-1 to 510-N with a write-word of status full. In this case, the status full means that the thirty-two (32) bits, i.e., four bytes, are packed into the write-word. Arbiter 512 also selects the address generator to output the write address for the corresponding write-word with status full.

Since shifter-less packers 510-1 to 510-N have the identical constitution, shifter-less packer 510-1 will be used as an example to describe these shifter-less packers. Shifter-less packer 510-1 includes: counter 521-1; write-word register 522-1; and OR circuit 523-1. Counter 521-1 is configured to output the number of packed write-bits in shifter-less packer 510-1 and output the status to write-word register 522-1. Write-word register 522-1 is configured to store packed write-bits as a write-word. OR circuit 523-1 is configured to perform a logical OR operation between the output of barrel shifter 513 and the output of write-word register 522-1.

The initialization of interleaver 500 is conducted as the same manner as that of interleaver 200 shown in FIG. 6 except that the following two procedures are added:

(1) Registers 522-1 to 522-N in shifter-less packers 510-1 to 510-N are initialized by an external CPU (not shown) as zero; and (2) Counters 521-1 to 521-N are initialized as zero.

Next, the operation of interleaver 500 will be described in the points that are different from the operation of the interleaver shown in FIG. 6.

In write controller 507, based on the address queue ID from arbiter 503, clock controller 514 enables the clock of one of shifter-less packers 510-1 to 510-N. At the same time, selector 509 selects one of the numbers of packed write-bits to control barrel shifter 513 based on the address queue ID. The numbers of packed write-bits are outputs of shifter-less packers 510-1 to 510-N.

In each of shifter-less packers 510-1 to 510-N, the output of barrel shifter 513 is ORed, i.e., subjected to a logical OR operation by the OR circuit, with the output of the write-word register. The output of the OR operation is stored in the write-word register. The outputs of the write-word registers 522-1 to 522-N are supplied to arbiter 512. Arbiter 512 selects any shifter-less packer 510-1 to 510-N with a full write-word and selects one of address generators 511-1 to 511-N to output a write address for the write-word of the selected shifter-less packer.

By using the address queue ID to select one of the numbers of packed bits to control barrel shifter 513 which is commonly provided for shifter-less packers 510-1 to 510-N, it is possible to reduce area of interleaver 500. This is because there is no barrel shifter in individual shifter-less packers 510-1 to 510-N.

According to one exemplary aspect of the present invention, a high throughput interleaver can be realized by using an address arbiter to select any address queue that is not empty for outputting an address. The address arbiter also outputs an ID of the selected address queue to a write controller. Then the write controller packs a write-bit to the corresponding write-word based on the address queue ID. This increases throughput of the interleaver by reducing cycles of waiting for data from an empty address queue.

According to another exemplary aspect of the present invention, a low cost interleaver that meets different requirements of interleave patterns can be realized. This is achieved by changing the number of processors and the number of address queues, both arranged in the address generator.

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that various modifications may be implemented by those skilled in the art without departing from the scope and spirit of the invention. Those skilled in the art could implement various other feature combinations without departing from the scope and spirit of the invention.

CITATION LIST

Patent Literature

WO03/058823 A1
EP-1850486-A1
U.S. Pat. No. 7,343,530 B2
U.S. Pat. No. 6,574,766 B2
JP-7-254862-A
WO2005/091509 A1

The invention claimed is:

1. An interleaver, comprising:
multiple processors configured to generate read-addresses in parallel for respective bits of multiple write-words;
multiple address queues configured to queue the read-addresses received from the respective processors, each of the address queues outputting a status thereof;
a first arbiter configured to select a non-empty address queue among the multiple address queues based on the status of each address queue, the first arbiter being outputting an address from the selected address queue while outputting an address queue ID of the selected address queue;
a decoder configured to decode the outputted address from the selected address queue into a word-address and a bit-address;
an input storage configured to store data to be interleaved, the input storage outputting a read-word based on the word-address;
a first selector configured to select a write-bit from the read-word based on the bit-address;
a write controller configured to arbitrate an individual write-bit to one of the write-words based on the address queue ID, the write controller generating write-addresses for respective write-words; and
an output storage configured to store the write-word based on the write-address.

2. The interleaver according claim 1, wherein the processors comprise programmable processors.

3. The interleaver according to claim 2, wherein the first arbiter comprises:
a controller configured to receive status signals from the address queues to output the address queue ID of any address queue with status of not empty; and
an address selector configured to select an address from the read-addresses received from the respective address queues based on the address queue ID and outputting the selected address.

4. The interleaver according to claim 2, wherein the write controller comprises:
multiple packers each of which packs a received write-bit into a write-word and outputs the write-word and a status of output of the write-word;
a second selector configured to select any of the packers to which a write-bit is transmitted from the first selector based on the address queue ID from the first arbiter;
multiple address generators configured to generate write-addresses for the write-words in the respective packers; and
a second arbiter configured to select a packer with a full write-word among the multiple packers based on the statuses received from the multiple packers, the second arbiter configured to output the write-word of the selected packer as write data and select an address generator corresponding to the selected packer to output a write-address generated by the respective address generator.

5. The interleaver according claim 1, wherein the processors comprise programmable processors configured to generate addresses for different interleave patterns.

6. The interleaver according to claim 5, wherein the first arbiter comprises:
a controller configured to receive status signals from the address queues to output the address queue ID of any address queue with status of not empty; and
an address selector configured to select an address from the read-addresses received from the respective address queues based on the address queue ID and outputting the selected address.

7. The interleaver according to claim 1, wherein the first arbiter comprises:
a controller configured to receive status signals from the address queues to output the address queue ID of any address queue with status of not empty; and
an address selector configured to select an address from the read-addresses received from the respective address queues based on the address queue ID and output the selected address.

8. The interleaver according to claim 7, wherein the write controller comprises:
multiple packers each of which packs a received write-bit into a write-word and outputs the write-word and a status of output of the write-word;
a second selector configured to select any of the packers to which a write-bit is transmitted from the first selector based on the address queue ID from the first arbiter;
multiple address generators configured to generate write-addresses for the write-words in the respective packers; and
a second arbiter configured to select a packer with a full write-word among the multiple packers based on the statuses received from the multiple packers, the second arbiter configured to output the write-word of the selected packer as write data, and select an address generator corresponding to the selected packer to output a write-address generated by the respective address generator.

9. The interleaver according to claim 7, wherein the write controller comprises:
multiple shifter-less packers each packing a shifted write-bit into a write-word;
a clock controller configured to enable a clock signal to one of the multiple shifter-less packers based on the address queue ID from the first arbiter;
a second selector configured to select a number of packed bits from the multiple shifter-less packers based on the address queue ID;
a barrel shifter configured to shift write-bits to a targeted write-bit position of write registers in the shifter-less packers based on an output of the second selector, the barrel shift outputting the shifted write-bits to shifter-less packers;
multiple address generators configured to generate write-addresses for the write-words in the respective shift-less packers; and
a second arbiter configured to select a shifter-less packer with a full write-word among the multiple shifter-less packers to output the write-word of the selected shifter-less packer as write data, the second arbiter selecting an address generator corresponding the selected shifter-less packer to output a write-address generated by the respective address generator.

10. The interleaver according to claim 9, wherein each of the shifter-less packers comprises:
a counter configured to count a number of packed write-bits in the shifter-less packer;
a write-word register configured to store the packed write-bits as the write-word; and
an OR circuit configured to perform OR operation between the output of the barrel shifter and an output of the write word register, and
wherein the counter outputs status of the write-word register.

11. The interleaver according to claim 1, wherein the write controller comprises:
multiple packers each of which packs a received write-bit into a write-word and outputs the write-word and a status of output of the write-word;

a second selector configured to select any of the packers to which a write-bit is transmitted from the first selector based on the address queue ID outputted by the first arbiter;

multiple address generators configured to generate write-addresses for the write-words in the respective packers; and a second arbiter configured to select a packer with a full write-word among the multiple packers based on the statuses received from the multiple packers, the second arbiter configured to output the write-word of the selected packer as write data, and select an address generator corresponding to the selected packer to output a write-address generated by the respective address generator.

12. The interleaver according to claim 11, wherein a data-width of an output of the first selector is the same as the number of adjacent bits selected from the read-word.

13. The interleaver according to claim 1, wherein the write controller comprises:

multiple shifter-less packers each packing a shifted write-bit into a write-word;

a clock controller configured to enable a clock signal to one of the multiple shifter-less packers based on the address queue ID outputted by the first arbiter;

a second selector configured to select a number of packed bits from the multiple shifter-less packers based on the address queue ID;

a barrel shifter configured to shift write-bits to targeted write-bit position of write registers in the shifter-less packers based on an output of the second selector, and output the shifted write-bits to shifter-less packers;

multiple address generators configured to generate write-addresses for the write-words in the respective shift-less packers; and a second arbiter configured to select a shifter-less packer with a full write-word among the multiple shifter-less packers to output the write-word of the selected shifter-less packer as write data, the second arbiter selecting an address generator corresponding the selected shifter-less packer to output a write-address generated by the selected address generator.

14. The interleaver according to claim 13, wherein each of the shifter-less packers comprises:

a counter configured to count the number of packed write-bits in the shifter-less packer;

a write-word register configured to store the packed write-bits as the write-word; and an OR circuit configured to perform OR operation between the output of the barrel shifter and an output of the write word register, and wherein the counter is configured to output the status of the write-word register.

15. The interleaver according to claim 1, wherein the write-bit consists of a single bit.

16. The interleaver according to claim 1, wherein the write-bit comprises multiple bits.

17. An interleaving method comprising:

generating multiple read-addresses for respective bits of multiple write-words;

queuing the multiple read-addresses in parallel in multiple address queues;

selecting a non-empty address queue among the multiple address queues based on the status of each address queue;

decoding an address from the selected address queue to a read-address and a bit-address;

extracting a read-word from data to be interleaved based on the read-address;

selecting a write-bit from the read-word based on the bit-address;

arbitrating an individual write-bit to one of the multiple write-words based on an address queue ID of the selected address queue; and generating write-addresses for the respective write-words.

18. The interleaving method according to claim 17, wherein the write-bit consists of a single bit.

19. The interleaving method according to claim 17, wherein the write-bit comprises multiple bits.

* * * * *